(12) United States Patent
Masters

(10) Patent No.: US 8,324,952 B2
(45) Date of Patent: Dec. 4, 2012

(54) TIME INTERPOLATOR CIRCUIT

(75) Inventor: Lewis W Masters, Los Altos, CA (US)

(73) Assignee: Phase Matrix, Inc., San Jose, CA (US)

( * ) Notice: Subject to any disclaimer, the term of this patent is extended or adjusted under 35 U.S.C. 154(b) by 28 days.

(21) Appl. No.: 13/101,038

(22) Filed: May 4, 2011

(65) Prior Publication Data

US 2012/0281806 A1 Nov. 8, 2012

(51) Int. Cl.
*H03H 11/16* (2006.01)
(52) U.S. Cl. ........................................ 327/231; 327/237
(58) Field of Classification Search .................. None
See application file for complete search history.

(56) References Cited

U.S. PATENT DOCUMENTS

| | | |
|---|---|---|
| 3,133,189 A | 5/1964 | Bagley et al. |
| 3,204,180 A | 8/1965 | Bray et al. |
| 3,983,481 A | 9/1976 | Nutt et al. |
| 4,433,919 A | 2/1984 | Hoppe |
| 4,439,046 A | 3/1984 | Hoppe |
| 4,620,788 A | 11/1986 | Giger |
| 4,719,608 A | 1/1988 | Genat et al. |
| 4,764,694 A | 8/1988 | Winroth |
| 4,772,843 A | 9/1988 | Asaka et al. |
| 4,870,629 A | 9/1989 | Swerlein et al. |
| 4,875,201 A | 10/1989 | Dalzell |
| 5,132,558 A | 7/1992 | Rustici |
| 5,191,336 A | 3/1993 | Stephenson |
| 5,199,008 A | 3/1993 | Lockhart et al. |
| 5,206,889 A | 4/1993 | Unkrich |
| 5,333,162 A | 7/1994 | Condreva |
| 5,359,404 A * | 10/1994 | Dunne ........................ 356/5.06 |
| 5,521,696 A * | 5/1996 | Dunne ........................ 356/5.07 |
| 5,631,553 A * | 5/1997 | Bose et al. ................. 324/76.24 |
| 5,684,760 A | 11/1997 | Hunter |
| 5,703,678 A | 12/1997 | Dunne |
| 5,703,838 A | 12/1997 | Gorbics et al. |
| 6,137,749 A | 10/2000 | Sumner |
| 6,246,737 B1 | 6/2001 | Kuglin |
| 6,324,125 B1 | 11/2001 | Frankowsky et al. |
| 6,822,485 B2 | 11/2004 | Kattan |
| 7,202,716 B1 | 4/2007 | Chao et al. |
| 2009/0009455 A1 * | 1/2009 | Kimura ........................ 345/89 |

OTHER PUBLICATIONS

Agilent Technologies, Application Note 200, Fundamentals of Electronic Counters.
Agilent Technologies, Application Note 200-1, Fundamentals of Microwave Frequency Counters.
Agilent Technologies, Application Note 200-3, Fundamentals of Time Interval Measurements.
Mota et al., "A High-Resolution Time Interpolator . . . ", IEEE J. Solid State Circuits, v. 34, p. 1360 (1999).
Henzler et al., "A Local Passive Time Interpolation Concept . . . ", IEEE J. Solid State Circuits, v. 43, p. 1666 (2008).
Jansson et al., "A CMOS Time-to-Digital Converter . . . ", IEEE J. Solid State Circuits, v. 41, p. 1286 (2006).
Stevens et al., "A Time-to-Voltage Converter . . . ", IEEE J. Solid State Circuits, v. 24, p. 1748 (1989).
Napolitano et al., "A Novel Sample-and-Hold-Based Time-to-Digital . . . ", IEEE Trans. Inst. and Meas., v. 59, p. 1019 (2010).
Nissinen et al., "On-Chip Voltage Reference-Based Time-to-Digital . . . ", IEEE Trans. Inst. and Meas., v. 58, p. 1938 (2009).

(Continued)

*Primary Examiner* — Cassandra Cox

(57) ABSTRACT

A time interpolator circuit increases the accuracy of digital counting circuits.

11 Claims, 3 Drawing Sheets

OTHER PUBLICATIONS

Xia et al., "Time-to-Voltage Converter . . . ", IEEE Trans. Inst. and Meas., v. 52, p. 1738 (2003).
Tadokoro et al., "Simple Voltage-to-Time Converter . . . ", IEEE Trans. Inst. and Meas., p. 120, May 1971.
Szplet et al., "Interpolating Time Counter . . . ", IEEE Trans. Inst. and Meas., v. 49, p. 879 (2000).
Rakovich et al., "A Wide-Range Voltage-to-Time Converter", IEEE Trans. Inst. and Meas., v. IM-22, p. 162 (1973).

* cited by examiner

TIME INTERPOLATOR CIRCUIT

TECHNICAL FIELD

The disclosure is related to time interpolator circuits.

BACKGROUND

A time interpolator circuit increases the resolution and accuracy of time measurements beyond the limits of digital circuits. Time interpolators are commonly used in frequency counters, which are instruments that measure the number of cycles of a repetitive signal per second. In a typical reciprocal frequency counter, a digital circuit counts the number of electronic clock pulses that occur per cycle of a signal to be measured. The frequency is then proportional to the reciprocal of this number. In actual practice most frequency counters count the number of clock pulses that occur during a large number of signal cycles. Thus the counter may start counting clock pulses at one cycle of the signal and stop millions of signal cycles later.

As an example, suppose that a frequency counter has a clock that runs at 10 MHz and the signal to be measured has a frequency of roughly 1 GHz. The counter begins counting clock pulses at one signal cycle and stops 100 million signal cycles later. Suppose that 999,437 clock pulses are counted between the first and 100 millionth signal cycles. This result means that the frequency of the nominally 1 GHz signal is actually about 1.000563 GHz (100 million signal cycles divided by 0.0999437 seconds). It may not be exactly 1.000563 GHz, however, because the time between the first signal cycle and the first clock pulse, and the time between the last signal cycle and the last clock pulse, haven't been measured. A time interpolator is a circuit that accounts for these fractional times to improve measurement accuracy.

An early time interpolator circuit example is described in "Electronic interpolating counter for the time interval and frequency measurement" by Bagley and Brooksby (U.S. Pat. No. 3,133,189), and numerous variations and improvements have followed. Many interpolators rely on the charging characteristics of a capacitor connected to a current source. The voltage across such a capacitor is:

$$V = \frac{1}{C}\int I dt$$

where V is the voltage, C is the capacitance and I is the current flowing into the capacitor. If I is constant, as is the case with a good quality current source, then:

$$V = \left(\frac{I}{C}\right)t$$

Thus, the voltage across the capacitor is directly proportional to the time during which current is allowed to flow into it. Furthermore, this voltage can be measured quite accurately and precisely with an analog-to-digital converter.

Despite the long history of interpolator circuits, room for improvements exists. Thus what is needed is a simple, accurate interpolator circuit appropriate for modern frequency counters and similar devices.

DETAILED DESCRIPTION

The time interpolator circuit described below provides good performance in frequency counters and other instruments. It is simple, inexpensive and easily interfaced to digital circuits.

Figure 1:
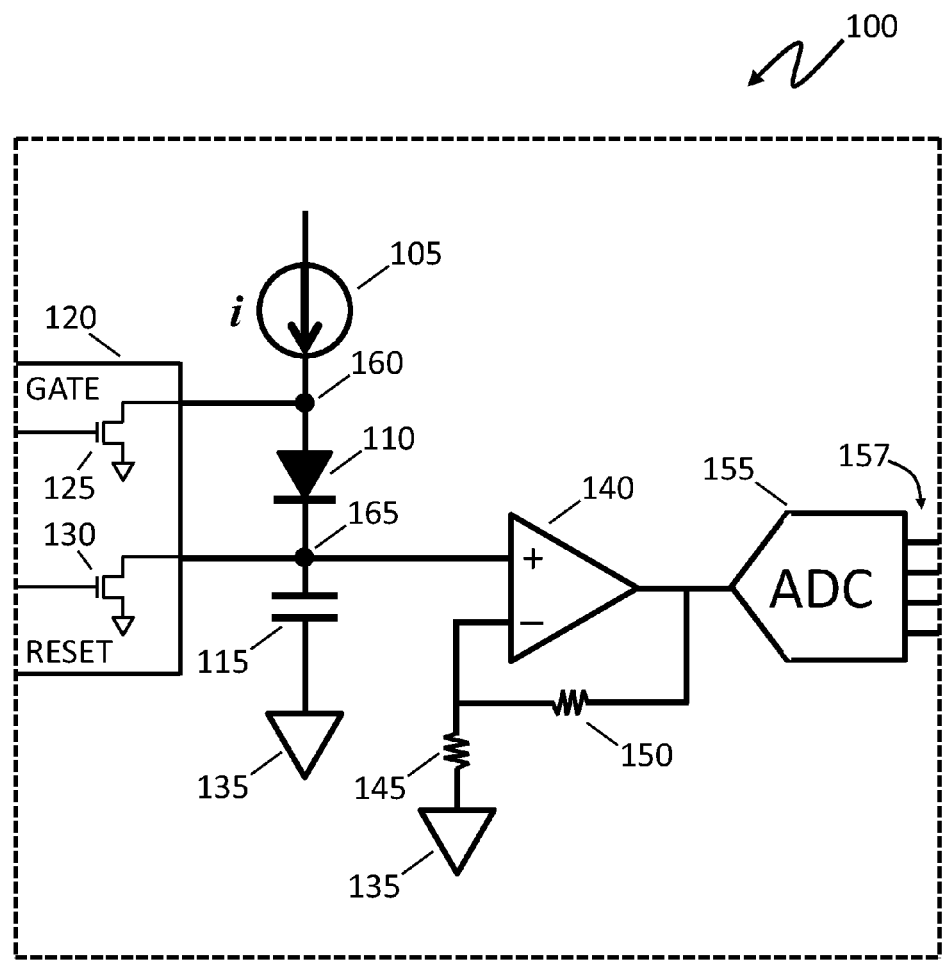
FIG. 1 is a schematic diagram of a time interpolator circuit.

FIG. 1 is a schematic diagram of a time interpolator circuit 100. In FIG. 1, current source 105 is connected to first circuit node 160, diode 110 is connected between first circuit node 160 and second circuit node 165, and capacitor 115 is connected between second circuit node 165 and ground 135. Logic circuit 120 contains switches 125 and 130 which are used to connect circuit nodes 160 and 165, respectively, to ground at various times. Switches 125 and 130 may be implemented as field effect transistors (FET) in a low-voltage logic chip, for example. Buffer amplifier 140, which may be implemented as an op-amp, is connected to circuit node 165. The amplifier presents high impedance to circuit node 165 and, along with feedback network resistors 145 and 150, scales the voltage at the node for input to analog-to-digital converter (ADC) 155. The digital output of the ADC is represented by lines 157.

Time is converted to voltage in the circuit of FIG. 1 through the charging of capacitor 115 by current source 105. Switch 125 is used to start and stop the charging, and switch 130 is used to discharge the capacitor after a measurement has been made. Diode 110 prevents the capacitor from discharging through switch 125 when that switch is on. The high-impedance input of buffer amplifier 140 allows the voltage across capacitor 115 (i.e. the voltage between circuit node 165 and ground) to be measured without discharging the capacitor. ADC 155 converts this voltage to digital form for further processing. Thus another name for the circuit of FIG. 1 is time to digital converter.

Buffer amplifier 140 and its feedback network resistors 145, 150 are not required if ADC 155 is able to directly measure the voltage across capacitor 115 without discharging it. In other words, the voltage measurement should not affect the capacitor voltage by more than the precision needed in a particular interpolation application. Whether or not a buffer amplifier is necessary depends on the input characteristics of the ADC.

Figure 2:
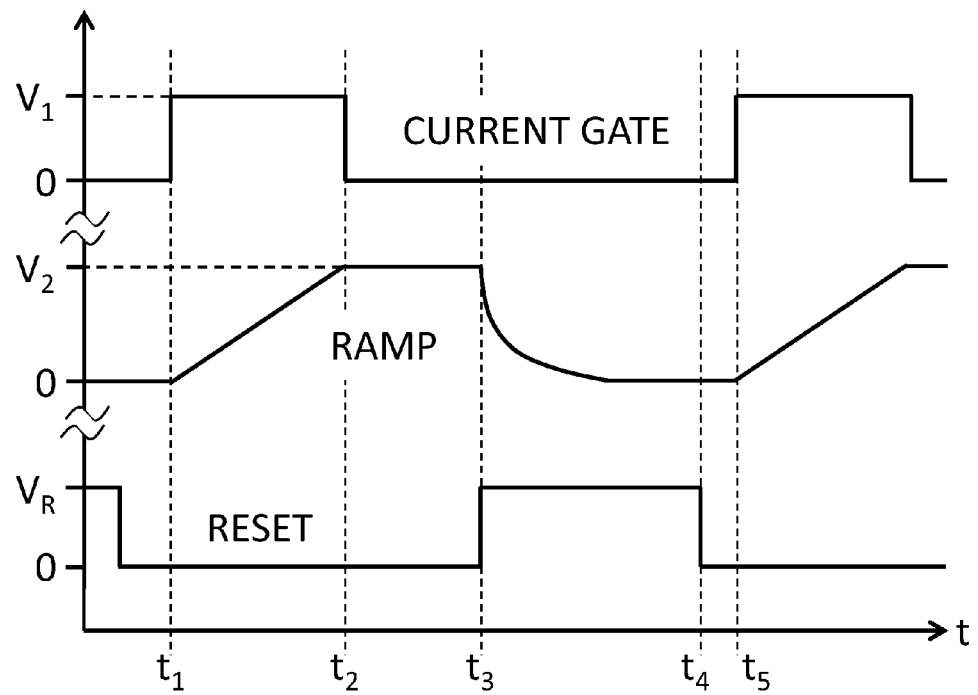
FIG. 2 is a timing diagram for various signals in the circuit of FIG. 1.

The operation of the circuit of FIG. 1 may be understood in more detail by referring to FIG. 2 which is a timing diagram for various signals in the circuit. FIG. 2 illustrates the timing of a current gate signal, capacitor voltage ramp, and reset signal. The current gate signal shows when capacitor 115 is charging. When the current gate signal is zero current flows from current source 105 through switch 125 to ground. When the current gate signal is $V_1$, switch 125 is off (i.e. non-conducting) and current flows from current source 105 through diode 110 and into capacitor 115.

The capacitor voltage ramp shows the voltage across capacitor 115. The capacitor charges linearly with time when the current gate signal is $V_1$ and stops charging when the current gate signal is zero. The voltage drop across diode 110 prevents capacitor 115 from charging when switch 125 is turned on. In other words the voltage drop across the diode is greater than the resistance of switch 125 in its conducting state multiplied by the current supplied by current source 105.

The reset signal shows when capacitor 115 is discharging. When the reset signal is $V_R$ circuit node 165 is connected to ground through switch 130 and capacitor 115 discharges.

When the reset signal is zero, switch 130 is off (i.e. non-conducting) and the capacitor may charge depending on the state of switch 125.

The circuit of FIG. 1 measures the time during which a current gate is open. In FIG. 2, this means the time that the current gate signal is $V_1$ (e.g. between times $t_1$ and $t_2$). Thus switch 125 controls the interpolation interval. Buffer amplifier 140 and ADC 155 measure the voltage across capacitor 115 after the end of the interpolation interval. Switch 130 resets the voltage to zero in preparation for the next measurement. Diode 110 prevents undesired charging and discharging of the capacitor.

At time $t_1$ in FIG. 2 the current gate signal changes from zero to $V_1$. Switch 125 opens and therefore current from current source 105 flows through diode 110 and charges capacitor 115. From time $t_1$ to time $t_2$, the voltage across capacitor 115 (i.e. the voltage between circuit node 165 and ground) increases linearly with time as indicated by the capacitor voltage ramp. At time $t_2$ the voltage across the capacitor has reached $V_2$ which is proportional to the elapsed time between $t_1$ and $t_2$:

$$V_2 = \left(\frac{I}{C}\right)(t_2 - t_1)$$

where I is the current supplied by current source 105 and C is the capacitance of capacitor 115.

This voltage remains constant and is available to be measured by buffer amplifier 140 and ADC 155 from time $t_2$ until time $t_3$. At time $t_3$ the reset signal changes from zero to $V_R$ and switch 130 turns on, connecting circuit node 165 to ground and discharging capacitor 115. The voltage across the capacitor rapidly decays to zero. Sometime before the next interpolation interval begins the reset signal changes back to zero at time $t_4$ and the circuit is returned to the state it was in just before time $t_1$. A new interpolation interval starts at time $t_5$.

Figure 3:
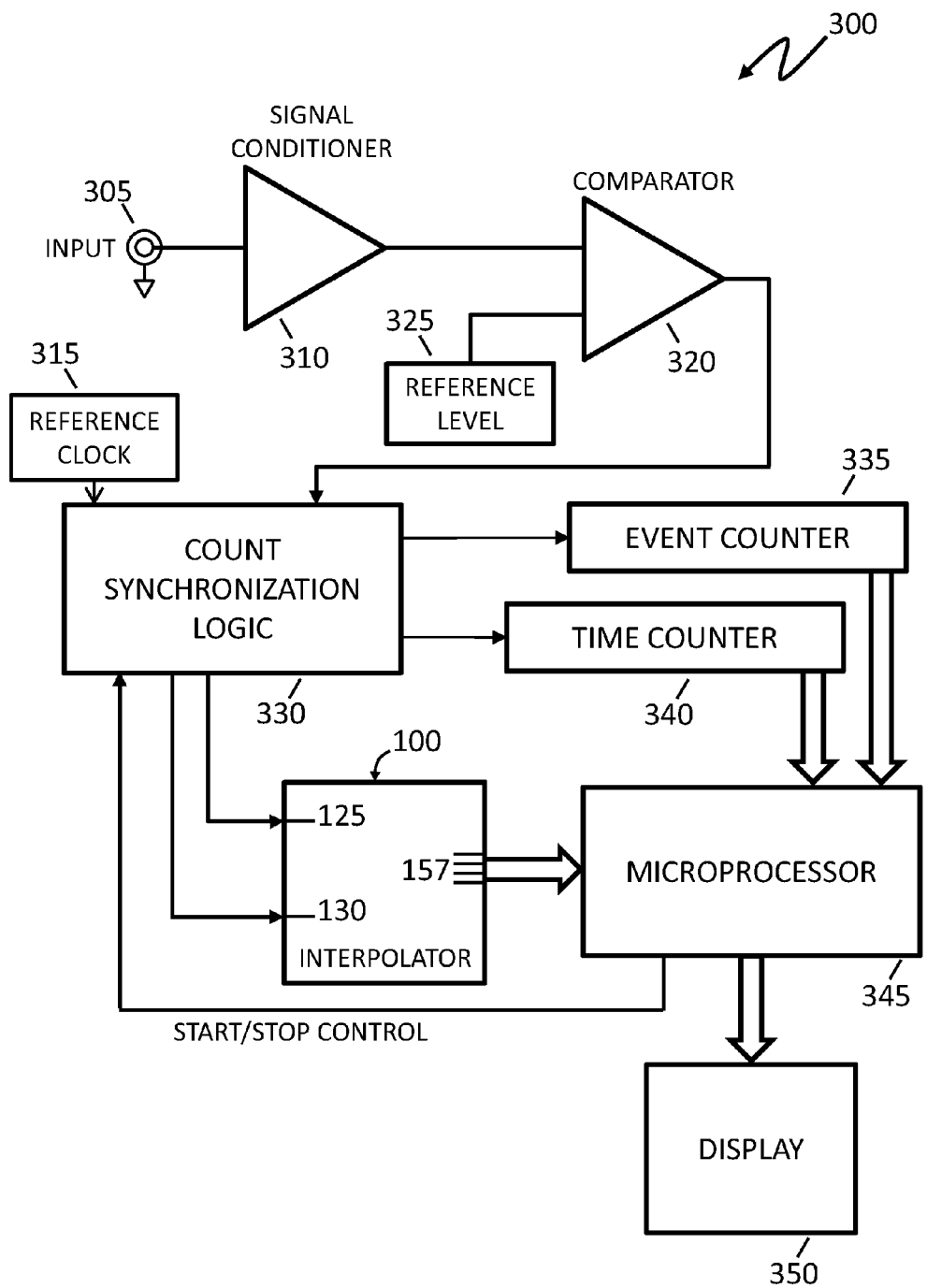
FIG. 3 is a block diagram of a frequency counter incorporating the time interpolator circuit of FIG. 1.

The time interpolator circuit of FIG. 1 may be incorporated into a frequency counter, time interval counter or other device that relies on time measurement such as a LIDAR transceiver. As an example, FIG. 3 is a block diagram of a frequency counter 300 incorporating the time interpolator circuit of FIG. 1. The frequency counter of FIG. 3 is conventional except for time interpolator circuit 100.

In FIG. 3 signals introduced at input 305 travel through signal conditioner 310 and comparator 320 before being input to count synchronization logic 330. Signal conditioner 310 may include signal protection, automatic gain control, AC/DC coupling and filters while comparator 320 compares an input signal to reference level 325. Count synchronization logic 330 also receives signals from reference clock 315 and start/stop control from microprocessor 345. The count synchronization logic sends output signals to event counter 335, time counter 340 and interpolator 100. Microprocessor 345 receives digital input from the two counters and the interpolator and sends digital output to an optional display 350.

Event counter 335 counts input events, e.g. pulses or cycles from input 305. Time counter counts clock events, e.g. pulses from an internal clock or reference clock 315. The counters send their results as digital data to microprocessor 345. Interpolator 100 is started and stopped by the count synchronization logic via switches 125 and 130 as described above. The interpolator also sends its digital results via output 157 to microprocessor 345 which carries out the necessary calculations to estimate the frequency of a signal at input 305. Interpolator 100 may interpolate between clock pulses at the beginning and end of a counting interval. The results of a frequency measurement may be displayed by display 350.

As another example, interpolator circuit 100 of FIG. 1 may be substituted for a conventional interpolator in a time interval counter in much the same way that the circuit is substituted for a conventional interpolator in the frequency counter in the example above. The architecture of a typical time interval counter has many similarities to that of a frequency counter; however, in a time interval counter start and stop synchronization logic blocks start and stop a time counter that counts pulses from a reference clock. Start and stop interpolators are used to keep track of the fractional clock pulse intervals that occur between a start signal and the next clock pulse, and between a stop signal and the next clock pulse.

In one implementation the interpolator described above provides approximately ten picosecond repeatability and is ready for a new measurement in less than one microsecond. Low-voltage logic interfacing is convenient when switches 125 and 130 are implemented as FETs. Regardless of specific implementation the circuit provides a simple, precise and inexpensive time-to-voltage conversion capability.

The above description of the disclosed embodiments is provided to enable any person skilled in the art to make or use the disclosure. Various modifications to these embodiments will be readily apparent to those skilled in the art, and the principles defined herein may be applied to other embodiments without departing from the scope of the disclosure. Thus, the disclosure is not intended to be limited to the embodiments shown herein but is to be accorded the widest scope consistent with the principles and novel features disclosed herein.

What is claimed is:

1. A time interpolator circuit comprising:
   a current source connected to a first circuit node;
   a diode connected between the first circuit node and a second circuit node;
   a capacitor connected between the second circuit node and ground; and,
   a logic circuit including a first switch capable of connecting the first circuit node to ground and a second switch capable of connecting the second circuit node to ground.

2. The time interpolator circuit of claim 1 further comprising:
   an analog-to-digital converter connected to the second circuit node.

3. The time interpolator circuit of claim 1 further comprising:
   an analog-to-digital converter for measuring voltage between the second circuit node and ground.

4. The time interpolator circuit of claim 1 further comprising:
   a buffer amplifier having an input connected to the second circuit node; and,
   an analog-to-digital converter connected to an output of the buffer amplifier.

5. The time interpolator circuit of claim 4, the buffer amplifier comprising an operational amplifier and a feedback resistor network.

6. The time interpolator circuit of claim 4, the buffer amplifier input having impedance high enough to prevent discharging the capacitor through the amplifier.

7. The time interpolator circuit of claim 4, the analog-to-digital converter measuring a voltage between the second circuit node and ground as scaled by the amplifier.

8. The time interpolator circuit of claim 1, the first and second switches being field effect transistors.

9. The time interpolator circuit of claim 1, the diode preventing current flow from the second circuit node to the first circuit node.

10. A frequency counter comprising:
- count synchronization logic having signal, reference clock, and start/stop control inputs;
- an event counter and a time counter both connected to the count synchronization logic;
- a microprocessor that receives digital input from the counters and sends a start/stop control signal to the count synchronization logic; and,
- an interpolator according to claim 3, the interpolator's first and second switches connected to the count synchronization logic and digital output from the interpolator's analog-to-digital converter connected to the microprocessor.

11. A time interval counter comprising:
- start synchronization logic and stop synchronization logic;
- a time counter connected to the start synchronization logic and to the stop synchronization logic;
- a first interpolator according to claim 3, the first interpolator connected to the start synchronization logic; and,
- a second interpolator according to claim 3, the second interpolator connected to the stop synchronization logic.

* * * * *